(12) United States Patent
Barnes

(10) Patent No.: US 6,417,699 B1
(45) Date of Patent: Jul. 9, 2002

(54) COMPARATOR CIRCUITS

(75) Inventor: William Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/466,374

(22) Filed: Dec. 17, 1999

(30) Foreign Application Priority Data

Dec. 18, 1998 (GB) .............................................. 9828039

(51) Int. Cl.⁷ ................................................. H03F 3/45
(52) U.S. Cl. .......................................... 327/57; 327/90
(58) Field of Search ........................ 327/50–52, 55–57, 327/63–65, 70, 78–83, 85, 89, 90

(56) References Cited

U.S. PATENT DOCUMENTS

| | | | |
|---|---|---|---|
| 4,697,112 A | 9/1987 | Ohtani et al. | 307/530 |
| 5,144,168 A | 9/1992 | Tran | 307/475 |
| 5,148,061 A | 9/1992 | Hsueh et al. | 307/475 |
| 5,668,486 A | 9/1997 | Brehmer | 327/66 |
| 6,044,036 A * | 3/2000 | Flannagan et al. | 327/52 |
| 6,060,912 A * | 5/2000 | Opris et al. | 327/215 |
| 6,147,514 A * | 11/2000 | Shiratake | 327/55 |

OTHER PUBLICATIONS

Standard Search Report carried out in respect of the United Kingdom case; completed on Jun. 10, 1999.
Partovi et al. *Flow–Through Latch and Edge–Triggered Flip–Flop Elements*, IEEE International Solid State Circuits Conference, Feb. 9, 1996, pp. 138–139.

* cited by examiner

*Primary Examiner*—My-Trang Nu Ton
(74) *Attorney, Agent, or Firm*—Wolf, Greenfield & Sacks, P.C.; James H. Morris; Robert A. Skrivanek, Jr.

(57) ABSTRACT

A comparator circuit with comparing means for comparing first and second voltages, has current source circuitry for providing current to said comparing means, said current source circuitry having an input for receiving a clock signal having first and second states, whereby the comparing means starts to compare the first and second voltages when the clock signal makes a transition from the first state to the second state; and means for determining when said comparing means has completed a comparison of said first and second voltages and for switching off said current source circuitry and hence said comparing means when said comparison has been completed

18 Claims, 2 Drawing Sheets

COMPARATOR CIRCUITS

FIELD OF THE INVENTION

The present invention relates to comparator circuits.

BACKGROUND OF THE INVENTION

Known comparator circuits are arranged to compare a first and a second voltage and to provide a first output if the first voltage is greater than the second voltage and a second output if the second voltage is greater than the first voltage. Typically, these known circuits require a clock signal having first and second levels. The comparison carried out by the comparator takes place when there is a transition in the clock signal from the first level to the second level. The known comparator circuit requires two clock edges to complete a comparing operation. This is undesirable in certain circumstances.

As the comparator requires two clock edges to complete a comparison, the comparator circuit will be on for the entire clock cycle In particular, current will not only be drawn in the comparison phase of the operation, but current will also be required during the evaluation phase. This is undesirable if the power requirements of the comparator circuit have to be minimised.

It is therefore an aim of preferred embodiments of the present invention to avoid or at least reduce at least one of the problems of the known arrangement

SUMMARY OF THE INVENTION

According to one aspect of the present invention, there is provided a comparator circuit comprising: comparing means for comparing first and second voltages; current source circuitry for providing current to said comparing means, said current source circuitry having an input for receiving a clock signal having first and second states, whereby the comparing means starts to compare the first and second voltages when the clock signal makes a transition from the first state to the second state; and means for determining when said comparing means has completed a comparison of said first and second voltages and for switching off said current source circuitry and hence said comparing means when said comparison has been completed.

In this way, the drawing of unnecessary current is avoided. As the comparing means are switched off when the comparison has been completed and not when the clock signal makes a further transition, it is possible in embodiments of the invention to make use only of a single edge of a clock signal to control the entire comparing operation including the evaluation of the results of the comparison.

Preferably, means are provided for preventing the consumption of current when said clock signal is in the first state. Thus when the comparing means are turned off, it is preferred that the circuit not draw any current.

Latch means may be provided for latching the result of the comparison carried out by the comparing means. Thus when the comparing means are turned off the results of the comparison are not lost.

Preferably, said comparing means is arranged to complete the comparison prior to the clock signal changing from the second state to the first state.

Said current circuitry may comprise logic circuitry receiving said clock signal and an output of said determining and switching means. The current source circuitry may, in use, be switched on when the clock signal makes a transition from the first state to the second state and switched off when said comparison has beer completed by the comparison means. The current source may comprise a transistor.

Preferably, clamping means are provided to ensure that least one node of the comparing means is connected to a power supply and said at least one node is at or near the voltage of the power supply when the clock is in the second state. The power supply may be ground. Thus before a comparison takes place, it can be ensured that the at least one node is at a known voltage.

The determining and switching means may comprise keeper means which are arranged when the comparison has been completed to hold one node of said comparing means at or near a value of a voltage supply. The voltage supply may be a positive voltage supply.

Preferably, a second node of said comparing means is maintained by said keeper means at a different voltage supply, when said comparison has been completed. The different voltage supply may be ground.

Preferably, the comparing means comprises a pair of transistors arranged to receive at their control terminals said first and second voltages.

The determining and switching means may comprise a pair of transistors arranged to remove the current path through the pair of transistors of the comparing means when said comparison has been completed.

The comparing means may comprise a pair of cross coupled transistors and a node coupled to each of the transistors of said pair, whereby in dependence on the relative sizes of the first and second voltages, one of said nodes will have a relatively low voltage and the other of the nodes will have a relatively high voltage, when said comparison has been completed. The nodes may be the same as the at least one node.

Preferably, said determining and switching means is arranged to receive first and second inputs, whereby when said inputs are different, said comparison has been completed. The determining and switching means may comprise a gate, such as a NAND gate.

The comparator circuit may be a differential comparator circuit. Alternatively, one of said first and second voltages is a reference voltage.

According to a second aspect of the present invention, there is provided a voltage measuring circuit comprising: means for comparing a first voltage indicative of the voltage to be measured with a second voltage; counting means; means for temporarily reducing the first voltage applied to the comparing means so that the comparing means provides a first output which differs from the second output when the first voltage been applied to the comparing means without being reduced, wherein the count provided by said counter is dependent on the size of the voltage to be measured.

Preferably, the reducing means comprise a first capacitor which is charged when the output of the comparing means has said first output. When said comparing provides said second output, said capacitor may be arranged to be discharged. Preferably, the amount by which said first capacitor is discharged and/or charged is dependent on the size of the voltage to be measured.

The reducing means may comprise a second capacitor which is arranged to cause said first capacitor to be discharged into said second capacitor when the output of said comparing means provides said second output. Preferably, said first capacitor is bigger than said second capacitor.

The reducing means may comprise a resistor connected between the voltage to be measured and the first voltage.

Preferably, the counting means is arranged to count for a predetermined number of cycles and the count at the end of the cycles is proportional to the size of the voltage to be measured. Preferably, said cycles are clock cycles. Preferably, the voltage to be measured has a maximum value and when said voltage to be measured is at said maximum value the count is equal to the number of cycles. The count maybe linearly proportional to the voltage to be measured. Alternatively, there may be a non linear relationship between the count and the size of the voltage to be measured.

The second voltage may be a reference voltage such as ground or any other suitable reference.

The inventions described in the first and second aspects may, but not necessarily be used together.

BRIEF DESCRIPTION OF THE DRAWINGS

For a better understanding of the present invention and as to how the same may be carried into effect, reference will now be made by way of example to the accompanying drawings in which.

DESCRIPTION OF THE PREFERRED EMBODIMENTS

Figure 1:
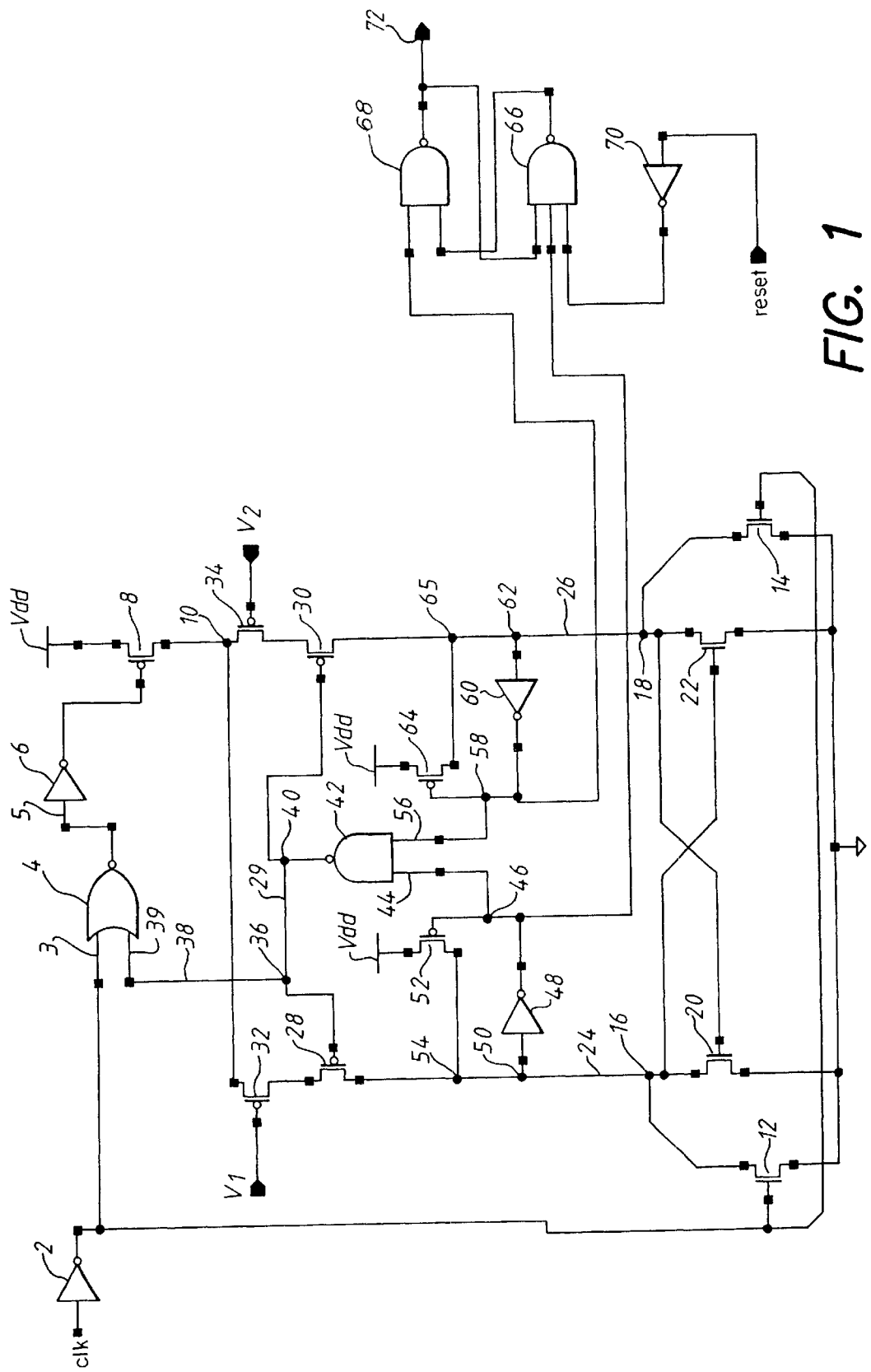
FIG. 1 shows a comparator circuit embodying the present invention.

Reference will now be made to FIG. 1 which shows a comparator circuit embodying the present invention. The comparator circuit makes use of a clock signal to control the operation of the circuit. The clock signal has two levels, a low level and a high level. As will be described in more detail hereinafter, the transition from the high level to the low level will cause the circuit to be reset. A transition from the low level to the high level will cause the circuit to carry out a comparison operation. The comparator circuit carries out a self-timed comparing operation which will be described hereinafter.

The clock signal is input to a first inverter 2. The output of the first inverter 2 is connected to one input 3 of a NOR gate 4. The output of the NOR gate 4 is connected to the input 5 of a second inverter 6. The output of the second inverter 6 is connected to the gate of a first p-type transistor 5. The first p-type transistor 8 has its drain connected to the voltage supply vdd and its source connected to a first node 10. The first p-type transistor 8 acts as a current source as will be discussed hereinafter.

The output of the first inverter 2 is also connected to the gate of first and second n-type transistors 12 and 14 The first and second n-type transistors define a matched pair. The sources of the first and second n-type transistors 12 and 14 are connected to ground whilst the drains of these transistors are connected to second and third nodes 16 and 18 respectively. Between the second node 16 and ground is arranged a third n-type transistor 20. Likewise, between the third node 18 and ground, a fourth n-type transistor 22 is provided. The third and fourth n-type transistors 20 and 22 define a matched pair and provide a cross coupled differential active load. The third and fourth n-type transistors 20 and 22 have their sources connected to ground and their drains connected to the second and third nodes 16 and 18 respectively. The gate of the third n-type transistor 20 is connected to the third node 18 whilst the gate of the fourth n-type transistor is connected to the second node 16.

A first connection 24 is provided which connects the drain of the third n-type transistor 20, the second node 16 and the drain of a second p-type transistor 28. A second connection 26 connects the drain of the fourth n-type transistor 22, the third node 18 and the drain of a third p-type transistor 30. The second and third p-type transistors 28 and 30 are a matched pair and act as gating transistors. The gates of the second and third p-type transistors are connected to each other by a third connection 29.

Connected between the first node 10 and the source of the second p-type transistor 28 is a fourth p-type transistor 32. The gate of the fourth p-type transistor 32 is arranged to receive a first voltage V1. Between the first node 10 and the source of the third p-type transistor 30 is arranged a fifth p-type transistor 34. The gate of the fifth p-type transistor 34 is arranged to receive a second voltage V2. The first and second voltages V1 and V2 are to be compared. In some embodiments of the present invention, one of these two voltages V1 and V2 may be a reference voltage. The fourth and fifth p-type transistors.32 and 34 are a matched pair which define a differential pair and steer current from the first p-type transistor 8 in dependence on the values of the first and second voltages V1 and V2.

A fourth node 36 is provided on the third connection 29 connecting the gates of the second and third p-type transistors 28 and 30. The fourth node 36 is connected by a fourth connection 38 to a second input 39 of the NOR gate 4. A fifth node 40 is also provided on the third connection 29 which is connected to the output of a first NAND gate 42. The first NAND gate 42 is arranged to receive two inputs 44 and 56. The first input 44 is connected to a sixth node 46 which is connected to the output of a third inverter 48. The input to the third inverter 48 is connected to a seventh node 50 between the second node 16 and the second p-type transistor 28.

The sixth node 46 is also connected to the gate of a sixth p-type transistor 52. The source of the sixth p-type transistor 52 is connected to the voltage supply Vdd and the drain is connected to an eighth node 54 which is between the second p-type transistor 28 and the seventh node 50.

In a similar manner, the second input 56 to the first NAND gate 42 is connected to a ninth node 58. The ninth node 58 receives the output of a fourth inverter 60 the input of which is connected to a tenth node 62. The tenth node 62 is between the third node 18 and the third p-type transistor 30. The ninth node 58 is also connected to the gate of a seventh p-type transistor 64. The sixth and seventh p-type transistors 52 and 64 define a matched pair. The source of the seventh p-type transistor 64 is connected to the voltage supply Vdd and the drain is connected to an eleventh node 65. The eleventh node 65 is between the tenth node 62 and the third p-type transistor 30.

The sixth node 46 is also connected to an input of a second NAND gate 66. The ninth node 58 is connected to the input of a third NAND gate 68. The third NAND gate 68 has a second input which is connected to the output of the second NAND gate 66. An output to the circuit is provided by the output of the third NAND gate 68. The output of the third NAND gate 58 is also connected to a second input of the second NAND gate 66. A third input to the second NAND gate 66 is provided by the output of a fifth inverter 70. The fifth inverter 70 receives an input from a reset signal. The reset signal will be derived from the clock. The second and third NAND gates 66 and 66 and he fifth inverter 70 define a resettable latch.

The operation of the circuit shown in FIG. 1 will now be described. In order for a comparison to be made between the first and second voltages V1 and V2 applied to the gates of the fourth and fifth p-type transistors, the clock signal needs to make a transition from a low level to a high level.

The operation of the comparator circuit will first be described in the situation where the clock signal has the low level. The output of the first inverter 2 will be high. This high output will be applied to the first input 3 of the NOR gate 4. The high output of the first inverter 2 will also be applied to the gates of the first and second n-type transistors 12 and 14. The first and second n-type transistors 12 and 14 will be on, thus ensuring that the second and third nodes 16 and 18 will be at or near ground. The gates of the third and fourth n-type transistors 20 and 22 will have the ground or near ground voltage applied thereto, thus ensuring that these transistors will both be off.

As the second and third nodes 16 and 18 are at or near ground, this means that the seventh and tenth nodes 50 and 62 will also be at or near ground. As a low input is applied to the third and fourth invertors 43 and 60, the output of these inverters will be high. The two inputs 44 and 56 to the first NAND gate 42 will thus both be high. The output of the first NAND gate 42 will therefore be low. The output of the first NAND gate 42 is applied to the second input 39 of the NOR gate 4 via the fifth and fourth nodes 40 and 36 and the fourth line 38. As the NOR gate 4 receives one high input and one low input, the output of the NOR gate 4 is low.

The output of the second inverter 6 will be high as the inverter 6 receives the output from the NOR gate 4. A high voltage is applied to the gate of the first p-type transistor 8 which ensures that this transistor is turned off. As the first p-type transistor a is turned off, no voltage will be applied to the sources of the fourth and fifth p-type transistors 32 and 34, thus ensuring that these transistors are turned off, regardless of the voltage applied to the gates of these transistors The second and third p-type transistors 28 and 30 receive their gate voltage from the output of the first NAND gate 42 which is low. However as the fourth and fifth transistors 32 and 34 are off, no voltage is applied to the sources of the fourth and fifth transistors 28 and 30. The fourth and fifth p-type transistors 28 and 30 will therefore be off. The gates of the sixth and seventh p-type transistors 52 and 64 will receive a high voltage which means that these transistors will be off.

Thus, when the clock signal has its low level, no current is drawn by the comparator shown in FIG. 1.

The transition of the clock signal from the low level to the high level allows the comparison to take place as will be now discussed. The high level clock signal is input to the first inverter 2. The output of the first inverter 2 is now high. A high level signal is applied to the first input 3 of the NOR gate 4. The high level output of the first inverter 2 is applied to the gates of the first and second n-type transistors 12 and 14, so that these transistors will now be on. The voltage at the second and third nodes 16 and 18 will depend on how strongly the second and third p-type transistors 28 and 30 are turned on.

At the very beginning of the comparison, the voltage at the second and third nodes will be low. The voltage at the second and third nodes 16 and 18 is applied to the gates of the third and fourth n-type transistors 20 and 22. he voltage applied to the gates of these transistors is low and initially these transistors will be off. As the voltage at the second and third nodes 16 and 18 is low, the voltage at the seventh and tenth nodes 50 and 62 will also be low. The third and fourth inverters 48 and 60 therefore have a low level input and a high level output. The high outputs of the third and fourth inverters 48 and 60 are applied to the first and second inputs 44 and 56 of the first NAND gate 42. The output of the first NAND gate 42 is low. A second low signal is thus applied to the second input 39 of the NOR gate 4. The high output of the NOR gate 4 is applied to the input of the second inverter 6, the output of which is low. The low output of the second inverter 6 is applied to the gate of the first p-type transistor 8 which is turned on.

The first and second voltages V1 and V2 which are to be compared are applied to the gates of the fourth and fifth p-type transistors 32 and 34. When the first p-type transistor 8 is turned on, the fourth and fifth p-type transistors 32 and 34 will also be turned on. As the fourth and fifth p-type transistors 32 and 34 are a matched pair, he transistor which receives the lower of the first and second voltages V1 and V2 will be turned on more strongly. To illustrate this, it will be assumed in the following that the first voltage V1 is the smaller of the two input voltages V1 and V2.

When the fourth and fifth p-type transistors 32 and 34 are turned on, the voltage at the second and third nodes 16 and 18 will increase. However, the voltage at the second node 16 will be greater that the voltage at the third node 18. This because the fourth p-type transistor 32 is more strongly turned on than the fifth p-type transistor 34. Once the voltage at one of the second and third nodes 16 and 18 rises above the threshold value for the third and fourth n-type transistors 20 and 22, the other of the second and third nodes 16 and 18 is pulled down to ground. If the first voltage V1 is the lower voltage, the voltage at the second node 16 will first rise above the threshold voltage value for the third and fourth n-type transistors 20 and 22. The second node 16 will then apply a voltage to the gate of the fourth n-type transistor 22 which is sufficient to switch that transistor 22 on. As the fourth n-type transistor 22 is on, the third node 18 is pulled down to ground. The third node 18 thus causes a low voltage to be applied to the gate of the third n-type transistor 20 which causes that transistor to be turned off. This causes the voltage at the second node 16 to remain high.

The comparison of the two voltages has been completed once one of the second and third nodes 16 and 18 is at a high voltage and the other of the second and third nodes 16 and 18 is at a low voltage. As the second node 16 is at a high voltage, the seventh node 50 will also be high. The third inverter 48 will therefore receive a high input and provide a low output. As the third node 18 is at a low voltage, the tenth node 62 will also be at a low voltage. The fourth inverter 60 thus receives a low input and provides a high output. The first and second inputs 44 and 56 to the first NAND gate 42 will thus be low and high respectively. The output of the first NAND gate 42 is now high. The NOR gate 4 therefore receives a high input from the first NAND gate 42 and a low input from the first inverter 2. The output of the NOR gate 4 is therefore low. This low output is applied to the second inverter 6 which provides a high output. A high voltage is thus applied to the gate of the first p-type transistor B. The p-type transistor 8 is turned off. The fourth and fifth p-type transistors 32 and 34 are therefore turned off so that the first and second voltages V1 and V2 are no longer compared.

Before the first p-type transistor 8 is turned off, the sixth p-type transistor 52 will have the output of the third inverter 48 which is low applied to its gate. The sixth p-type transistor 52 will therefore be on. This pulls the second, seventh and eighth nodes 16, 50 and 54 up to the supply voltage Vdd. Accordingly, when the first p-type transistor 8 is turned off, the sixth p-type transistor 52 will remain on as the third inverter 48 will continue to provide a low output. This is because the third inverter 48 receives a high input from the seventh node 50. The seventh p-type transistor 64 will be off as it receives at its gate a high output from the fourth inverter 60 and will remain off when the first p-type transistor 8 is turned off.

Before the first p-type transistor 8 is turned off, the output of the third inverter 48, which is low is applied to one of the inputs of the second NAND gate 66. The output of the fourth inverter 60, which is high is applied to one of the inputs of the third NAND gate 68. The output of the second NAND gate 66 will be high. This because a NAND gate will only provide a low output if all of its inputs are high. The second input of the third NAND gate 68 is from the output of the second NAND gate 66 and is also high. The output of the third NAND gate 68 will therefore be low. The output of the third NAND gate 68 will remain unchanged until the reset signal is applied to the fifth inverter 70. The output of the third NAND gate 68 will be high if the second voltage V2 is smaller than V1. The reset signal is low during the evaluation of the comparison. The sixth and seventh p-type transistors 52 and 64 act as keepers to ensure that even when the first p-type transistor 8 is turned off, the correct inputs to the second and third NAND gates 66 and 68 are maintained.

When the clock signal makes a transition from the high level to the low level, the reset signal goes high. During the reset part of the cycle, when the clock signal is low, the outputs of the third and fourth invertors 48 and 60 will be high, as discussed hereinbefore. The output of the fifth inverter 70 will be low. The second NAND gate 66 will therefore receive one low input and one high input so that its output will be high. The third NAND gate 68 therefore receives two high inputs and so its output will be low.

To explain the operation of the circuit shown in FIG. 1, the situation where the first voltage V1 is less than the second voltage V2 has been described. The operation of the circuit will be similar when the second voltage V2 is less than the first voltage V1. However, the fifth p-type transistor 34 will be on more strongly so that the second node 16 will be at ground whilst the third node will have a voltage thereon. The output of the third inverter 48 will be high whilst the output of the fourth inverter 60 will be low. The seventh p-type transistor 64 will be on whilst the sixth p-type transistor 52 will be off. The output of the third NAND gate 68 will be high.

Figure 2:
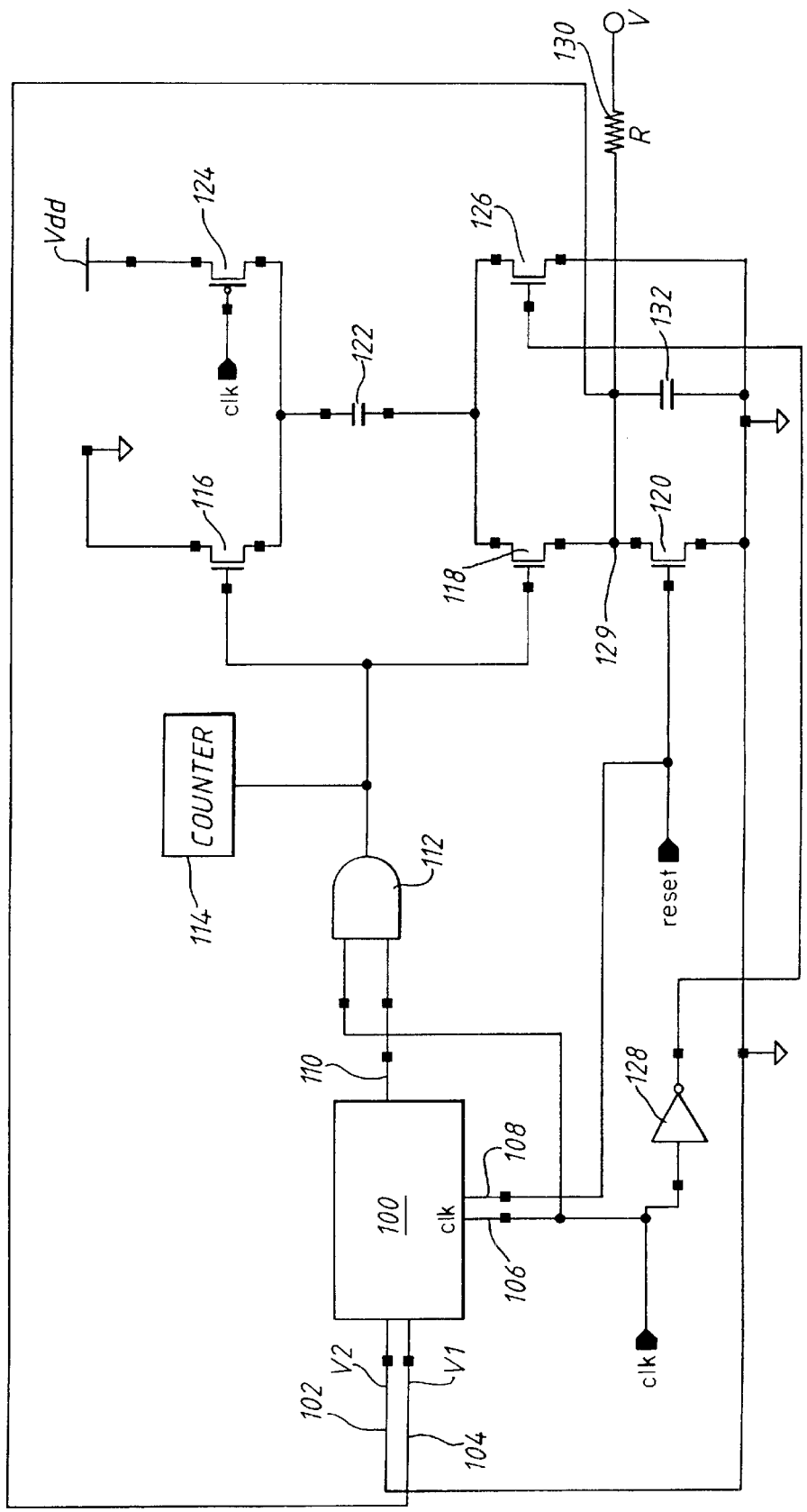
FIG. 2 shows a circuit including the comparator circuit of FIG. 1.

FIG. 2 shows a circuit including the comparator circuit of FIG. 1 which is able to provide a measure of the size of a voltage, which in the illustrated example is V. The comparator circuit of FIG. 1 is indicated by the reference number 100. The comparator circuit 100 is arranged to receive the first and second voltages V1 and V2, which are to be compared, via inputs 102 and 104 respectively. The relationship between V and V1 will be described hereinafter. The comparator circuit 100 also receives a clock signal via a third input 106. The comparator circuit 100 has a fourth input 108 for the reset signal. The comparator circuit 100 has one output 110. The first and second inputs 102 and 104 correspond to the inputs to the fourth and fifth p-type transistors 32 and 34 of FIG. 1. The third and fourth inputs 106 and 108 of the comparator circuit 100 correspond to the input to the first inverter 2 and the input to the fifth inverter 70 respectively, of the circuit of FIG. 1. The output 110 of the comparator circuit 100 corresponds to the output 72 of the circuit of FIG. 1.

In the circuit shown in FIG. 2, the second voltage V2 is a reference voltage and is at ground. The output 110 of the comparator circuit 100 is connected to one input of an AND gate 112. A second input of the AND gate 112 is arranged to receive the clock signal. The output of the AND gate 112 is connected to a counter 114 which counts the number of times that the AND gate 112 provides a particular output, for example a high output. This corresponds to the first voltage V1 being greater than the second voltage V2. The output of the AND gate 112 is also connected to the gates of first and second n-type transistors 116 and 118. The first and second n-type transistors 116 and 118 are a matched pair.

A first capacitor 122 is connected between the source of the first n-type transistor 116 and the drain of the second n-type transistor 118. The drain of the first n-type transistor 116 is connected to ground. The source of the second n-type transistor 118 is connected to the drain of a third n-type transistor 120 which has the same characteristics as the first and second n-type transistors 116 and 118. The gate of the third n-type transistor 120 is connected to receive the reset signal and the source is connected to ground.

A first p-type transistor 124 is connected in parallel with the first n-type transistor 116 with its drain connected to the same end of the first capacitor 122 as the first n-type transistor 116. The source of the first p-type transistor 124 is connected to a voltage supply Vdd and the gate is arranged to receive the clock signal.

A fourth n-type transistor 126 is arranged in parallel with the second and third transistors 118 and 120 and has its drain connected to the same end of the first capacitor 122 as the second n-type transistor 118. The clock signal is input to an inverter 128, the output of which is connected to the gate of the fourth n-type transistor 126.

A first node 129 is provided between the source of the second n-type transistor 118 and the drain of the third n-type transistor 120. The first node 129 is connected to one end of a resistor 130, the other end of which is connected to the voltage V to be measured. The voltage at the node 129 is the first voltage V1 which is input to the comparator circuit 100. A second capacitor 132 is connected at one end to the first node 129 and at its other end to ground. The second capacitor 132 is bigger than the first capacitor 122. In some embodiments of the circuit shown in FIG. 2 all of the circuit will be included in an integrated circuit. In other embodiments of the present invention, all of the circuit except the resistor 130 will be included in an integrated circuit. The resistor 130 will be external to the integrated circuit in this modification.

The operation of the circuit shown in FIG. 2 will now be described. When the clock signal is high, the comparator circuit 100 compares the first and second voltages. If the first voltage. V1 is greater than the second voltage V2, then the output of the comparator 100 will be high. The frequency with which this occurs will depend on the size of the voltage V to be measured.

When the output of the comparator circuit 100 is high and the clock signal is high, the output of the AND gate 112 will be high. The counter 114 is arranged to increment its count by one each time the output of the AND gate 112 is high. When the output of the AND gate 112 is high, a high voltage is applied to the gates of the first and second n-type transistors 116 and 118 which will therefore be on. The clock signal which is applied to the p-type transistor 124 is high and therefore this transistor will be off. The gate of the third n-type transistor 120 receives the reset signal which is low when the clock signal is high and therefore this transistor will be turned off. The fourth n-type transistor 126 has a low voltage at its gate from the inverter 128 and accordingly will be off.

When the output of the AND gate 112 is low and the clock signal is low, the first capacitor 122 will have one end connected to the voltage supply Vdd via the first p-type transistor 124 and the other end connected to ground via the fourth n-type transistor 126. The first capacitor 122 will therefore be charged. The second capacitor 132, which is larger than the first capacitor 122 is connected to the voltage V via the resistor 130 at a first end and connected to ground at its other end. The voltage applied to one end of the capacitor 132 is V1. The value of V1 will vary and is dependent on the size of the second capacitor relative to the resistor 130 and the charge stored on the second capacitor 132.

If V1 is greater than V2 and the clock signal is high, then the output of the AND gate is high, the first and second capacitors 122 and 132 are effectively connected in parallel. One end of the first capacitor 122 is connected to ground via the first n-type transistor 116. The other end of the first capacitor 122 is connected to the voltage to be measured V via the second n-type transistor 118 and the resistor 130. The second capacitor 132, which is bigger than the first capacitor 122 is connected to ground at one end and at the other end to the voltage V to be measured via the resistor 130. It should be appreciated that prior to the connection of the first and second capacitors to one another, the voltage at the end of the first capacitor 122 to be connected to one end of the second capacitor 132 is negative whilst the voltage at the one end of the capacitor 132 to be connected to the first capacitor 122 will be positive. Depending on the charges accumulated on each of the capacitors 122 and 132, charge will tend to flow from one capacitor to the other.

This at least partially discharges the second capacitor 132. The amount of charge discharged by the second capacitor and the size of V will determine the value of V1 applied to the comparator circuit 100. If V is large, a relatively large V1 will be applied to the comparator circuit 100 so that for every clock cycle, the count will be increased by one. However if V is not so large, the state of the second capacitor 132 during the comparing operation performed by the comparator circuit when the clock cycle is high may cause V1 to be negative so that the output of the comparator circuit 100 will be low. The number of clock cycles taken for V1 to become greater than V2 will depend on the size of the voltage to be measured. For example if the largest voltage which is to be measured is Vmax and the measurement is performed over 1000 clock cycles, the count will be 1000. If the voltage to be measured is ½Vmax, then the count will be 500. In other words, the output of the comparator circuit 100 will be high every other cock cycle. If the voltage to be. measured is ½Vmax then the count will be 250 and so on. The count is generally performed over a fixed number of cycles.

In the preferred embodiment there is a linear relationship between the size of the count and the size of the voltage. However in other embodiments of the present invention, a different relationship can be used. The capacitor 122 and resistor 130 effectively set the value associated with each count.

When the counter is reset by the reset signal once a measuring operation has been completed, for example after 1000 clock cycles, the reset signal will also be applied to the third n-type transistor 120 which will be on. The output of the AND gate 112 will be low so that the second capacitor 132 is connected in parallel with the third n type transistor 120 and accordingly will be discharged ready for the next measuring operation. In the reset mode, the input 104 is clamped by transistor 120.

It should be noted that the comparator circuit of FIG. 1 can be replaced by any suitable other comparator circuit in FIG. 2.

The term "node" has been used to conveniently describe the arrangements shown in FIGS. 1 and 2. However it should be appreciated, a smaller number of nodes is provided. For example the nodes 62, 18 and the gate of transistor 20 of FIG. 1 are in fact a single node.

What is claimed is:

1. A comparator circuit comprising:

comparing means for comparing first and second voltages:

current source circuitry for providing current to said comparing means, said current source circuitry having an input for receiving a clock signal having first and second states, whereby the comparing means starts to compare the first and second voltages when the clock signal makes a transition from the first state to the second state; and means for determining when said comparing means has completed a comparison of said first and second voltages and for switching off said current source circuitry and hence said comparing means when said comparison has been completed.

2. The comparator circuit of claim 1, wherein means are provided for preventing the consumption of current when said clock signal is in the first state.

3. The comparator circuit of claim 1, wherein latch means are provided for latching the result of the comparison carried cut by the comparing means.

4. True comparator circuit of claim 1, wherein said comparing means is arranged to complete the comparison prior to the clock signal changing from the second state to the first state.

5. The comparator circuit of claim 1, wherein said current source circuitry comprises logic circuitry receiving said clock signal and an output of said determining and switching means.

6. The comparator circuit as claimed in claim 5, wherein said current source circuitry is, in use, switched on when the clock signal makes a transition from the first state to the second state and is switched off when said comparison has been completed by the comparison means.

7. The comparator circuit of claim 1, wherein clamping means are provided to ensure that at least one node of the comparing means is connected to a power supply and said at least one node is at or near the voltage of the power supply when the clock is in the first state.

8. The comparator circuit of claim 7, wherein said power supply is ground.

9. The comparator circuit of claim 1, wherein said determining and switching means comprise keeper means which are arranged when the comparison has been completed to hold one node of said comparing means at or near a value of a voltage supply.

10. The comparator circuit of claim 9, wherein said voltage supply is a positive voltage supply.

11. The comparator circuit of claim 9, wherein a second node of said comparing means is maintained by said keeper means at a different voltage supply, when said comparison has been completed.

12. The comparator circuit of claim 11, wherein said different voltage supply is ground.

13. The comparator circuit of claim 1, wherein said comparing means comprises a pair of transistors arranged to receive at their control terminals said first and second voltages.

14. The comparator circuit of claim 13, wherein said determining and switching means comprises a pair of transistors arranged to remove the current path through the pair of transistors of the comparing means when said comparison has been completed.

15. The comparator circuit of claim 1, wherein said comparing means comprises a pair of cross coupled transistors and a node coupled to each of the transistors of said pair, whereby in dependence on the relative sizes of the first and second voltages, one of said nodes will have a relatively low voltage and the other of the nodes will have a relatively high voltage, when said comparison has been completed.

16. The comparator circuit of claim 1, wherein said determining and switching means is arranged to receive first and second inputs, whereby when said inputs are different, said comparison has been completed.

17. The comparator circuit of claim 1, wherein said comparator circuit is a differential comparator circuit.

18. The comparator circuit of claim 1, wherein one of said first and second voltages is a reference voltage.

* * * * *

UNITED STATES PATENT AND TRADEMARK OFFICE
CERTIFICATE OF CORRECTION

PATENT NO.   : 6,417,699 B1
DATED        : July 9, 2002
INVENTOR(S)  : William Barnes It is certified that error appears in the above-identified patent and that said Letters Patent is hereby corrected as shown below:

<u>Column 5,</u>
Lines 34-42, should read:

-- The second and third p-type transistors 28 and 30 receive their gate voltage from the output of the first NAND gate 42 which is low. However, as the fourth and fifth transistors 32 and 34 are off, no voltage is applied to the sources of the second and third transistors 28 and 30. The second and third p-type transistors 28 and 30 will therefore be off. The gates of the sixth and seventh p-type transistors 52 and 64 will receive a high voltage which means that these transistors will be off.

Signed and Sealed this

Third Day of December, 2002

JAMES E. ROGAN
*Director of the United States Patent and Trademark Office*